United States Patent
Xie et al.

(10) Patent No.: US 10,050,118 B2
(45) Date of Patent: Aug. 14, 2018

(54) SEMICONDUCTOR DEVICE CONFIGURED FOR AVOIDING ELECTRICAL SHORTING

(71) Applicant: GLOBALFOUNDRIES Inc., Grand Cayman (KY)

(72) Inventors: Ruilong Xie, Schenectady, NY (US); Ryan Ryoung-han Kim, Albany, NY (US); Chanro Park, Clifton Park, NY (US); William James Taylor, Jr., Clifton Park, NY (US); John A. Iacoponi, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 541 days.

(21) Appl. No.: 14/269,566

(22) Filed: May 5, 2014

(65) Prior Publication Data

US 2015/0318345 A1 Nov. 5, 2015

(51) Int. Cl.
| *H01L 29/66* | (2006.01) |
| *H01L 21/336* | (2006.01) |
| *H01L 29/06* | (2006.01) |
| *H01L 29/78* | (2006.01) |

(52) U.S. Cl.
CPC .......... *H01L 29/6653* (2013.01); *H01L 29/06* (2013.01); *H01L 29/6656* (2013.01); *H01L 29/66795* (2013.01); *H01L 29/785* (2013.01)

(58) Field of Classification Search
CPC .................. H01L 29/6653; H01L 29/6656
USPC ........ 438/303, 184, 230, 740; 257/386, 389, 257/333
See application file for complete search history.

(56) References Cited

U.S. PATENT DOCUMENTS

| 5,164,801 | A | * | 11/1992 | Hieda | H01L 21/823864 |
| | | | | | 257/344 |
| 6,245,625 | B1 | * | 6/2001 | Gau | H01L 21/76897 |
| | | | | | 257/E21.507 |
| 6,383,862 | B2 | | 5/2002 | Jang | |
| 6,420,250 | B1 | * | 7/2002 | Cho | H01L 21/28247 |
| | | | | | 257/344 |
| 6,495,889 | B1 | * | 12/2002 | Takahashi | H01L 21/76897 |
| | | | | | 257/331 |
| 6,649,490 | B1 | * | 11/2003 | Lee | H01L 21/76897 |
| | | | | | 257/E21.507 |
| 7,410,854 | B2 | | 8/2008 | Yao et al. | |
| 7,560,344 | B2 | | 7/2009 | Kim et al. | |

(Continued)

FOREIGN PATENT DOCUMENTS

CN 103187445 A 7/2013

*Primary Examiner* — Calvin Lee
(74) *Attorney, Agent, or Firm* — Heslin Rothenberg Farley & Mesiti P.C.

(57) ABSTRACT

In one aspect a semiconductor device as set forth herein can include a spacer having a first section of a first material and a second section of a second material, the second section disposed above a certain elevation and the first section disposed below the certain elevation. In one aspect a semiconductor device as set forth herein can include a conductive gate structure having a first length at elevations below a certain elevation and a second length at elevations above the certain elevation, the second length being less than the first length. A semiconductor device having one or more of a plural material spacer or a reduced length upper elevation conductive gate structure can feature a reduced likelihood of electrical shorting.

7 Claims, 8 Drawing Sheets

(56) References Cited

U.S. PATENT DOCUMENTS

| | | |
|---|---|---|
| 7,812,411 B2 * | 10/2010 | Cheng .......................... 257/410 |
| 8,860,110 B2 * | 10/2014 | Lee ............................... 257/296 |
| 2007/0284583 A1 | 12/2007 | Saito |
| 2008/0012067 A1 | 1/2008 | Wu |
| 2008/0048262 A1 | 2/2008 | Lee et al. |
| 2008/0230815 A1 | 9/2008 | Ekbote et al. |
| 2008/0237726 A1 * | 10/2008 | Dyer ............... H01L 21/823807 257/369 |
| 2009/0227077 A1 | 9/2009 | Anderson et al. |
| 2012/0196410 A1 | 8/2012 | Tsai et al. |
| 2013/0200461 A1 * | 8/2013 | Liu et al. ...................... 257/369 |
| 2013/0343121 A1 | 12/2013 | Fukutome |
| 2014/0015104 A1 | 1/2014 | Su et al. |
| 2014/0042491 A1 | 2/2014 | Chen et al. |

* cited by examiner

SEMICONDUCTOR DEVICE CONFIGURED FOR AVOIDING ELECTRICAL SHORTING

FIELD OF THE INVENTION

There is set forth herein a semiconductor device, and more particularly a semiconductor device featured for reduction of a likelihood of an electrical shorting.

BACKGROUND

Different discrete semiconductor devices may be fabricated to have one or more different device characteristics, such as switching speed, leakage power consumption, etc. Multiple different designs may each provide optimization of one or more of these characteristics for devices intended to perform specific functions. For instance, one design may increase switching speed for devices providing computational logic functions, and another design may decrease power consumption for devices providing memory storage functions. A semiconductor device having multiple discrete devices optimized for different functions presents challenges in terms of system complexity, system footprint and cost.

Performance of a semiconductor device can be at significant risk where there is a likelihood of electrical shorting of a discrete semiconductor device.

BRIEF DESCRIPTION

In one aspect a semiconductor device as set forth herein can include a spacer having a first section of a first material and a second section of a second material, the second section disposed above a certain elevation and the first section disposed below the certain elevation. In one aspect a semiconductor device as set forth herein can include a conductive gate structure having a first length at elevations below a certain elevation and a second length at elevations above the certain elevation, the second length being less than the first length A semiconductor device having one or more of a plural material spacer or a reduced length upper elevation conductive gate structure can feature a reduced likelihood of electrical shorting.

BRIEF DESCRIPTION OF THE SEVERAL VIEWS OF THE DRAWINGS

One or more aspects as set forth herein are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

An aspect of a semiconductor device 100 is illustrated with reference to FIGS. 1-9.

Figure 1:
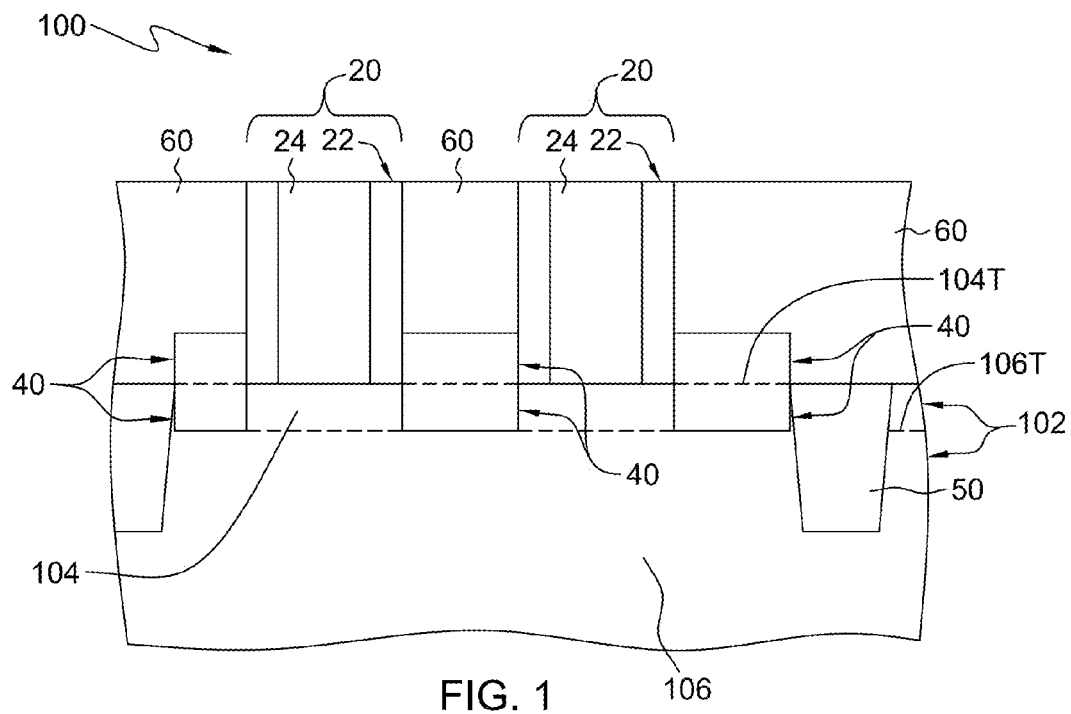
FIGS. 1-8 are cross-sectional views illustrating a semiconductor device in an intermediary stage of fabrication and being fabricated to include a gate resistant to degradation during etching.

Referring to FIG. 1, a section of each spacer 22 of semiconductor device 100 can be removed and replaced with replacement spacer material. FIG. 1 illustrates a semiconductor device 100 in an intermediary stage of fabrication after depositing of conductive gate structure 24 and chemical mechanical planarization (CMP). Semiconductor device 100 can include a substrate structure 102 and one or more gates 20. Gates 20 can include conductive gate structure 24. Gate structure 24 can include one or more conductive layer. Semiconductor device 100 can also include one or more source/drain 40. A field effect transistor (FET) can include gate 20 and first and second source/drains 40 disposed at first and second ends of a gate 20 shown in FIG. 1. Semiconductor device 100 can also include shallow trench isolation formations 50 separating discrete semiconductor devices. Semiconductor device 100 can also include dielectric material 60, e.g. oxide such as silicon dioxide ($SiO_2$) above source/drains. Dielectric material 60 can be disposed between gates 20 and adjacent gates 20. In one embodiment, spacers 22 in the stage of fabrication depicted in FIG. 1 can be formed of first spacer material, e.g. dielectric material, e.g. silicon mononitride (SiN), silicon nitride ($Si_3N_4$), or a low K dielectric material, e.g., silicon carbide (SiC), silicon boron nitride (SiBN), silicon oxyfluoride (SiOF) or silicon oxycarbide (SiOC). Each source/drain 40 depicted in FIG. 1 can include a doped substrate section below a top elevation of fin 104 (depicted with a dashed line) and an epitaxial growth section above a top elevation of fin 104. A substrate structure 102 in one embodiment can include a fin 104 or a FET and a bulk substrate 106 from which fin 104 can contiguously extend. A fin 104 can extend from a top elevation 106T of bulk substrate 106 to a top elevation 104T of fin 104. In one embodiment substrate structure 102 can be absent a fin 104. A top elevation herein can be regarded as a termination elevation.

Figure 2:
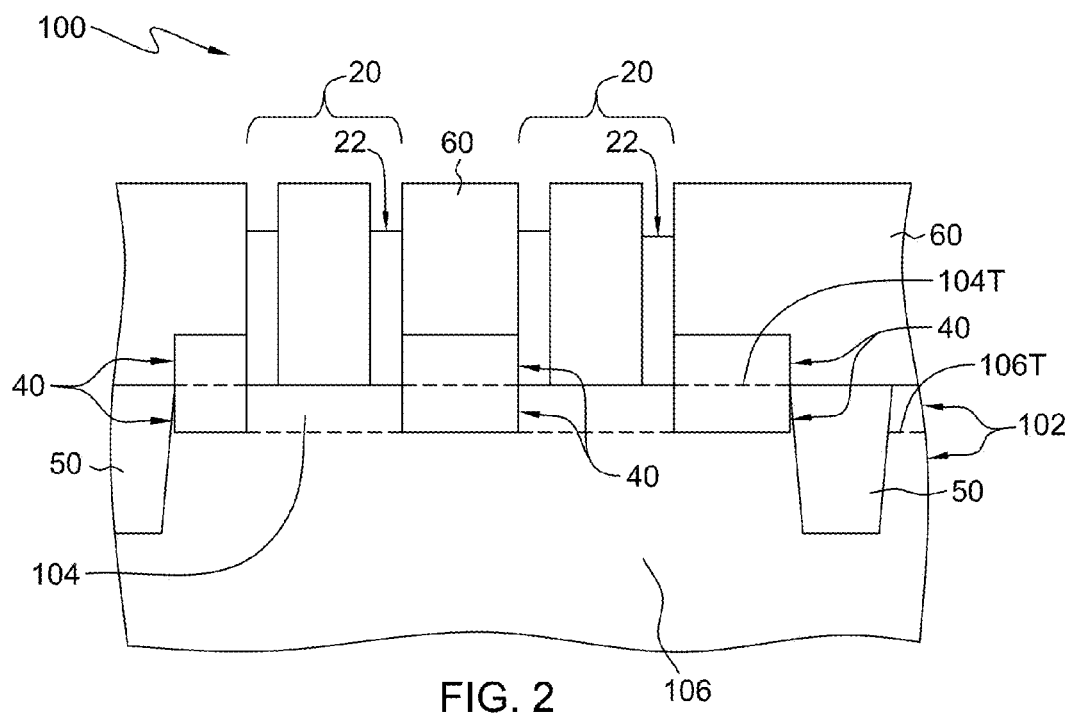
Figure 3:
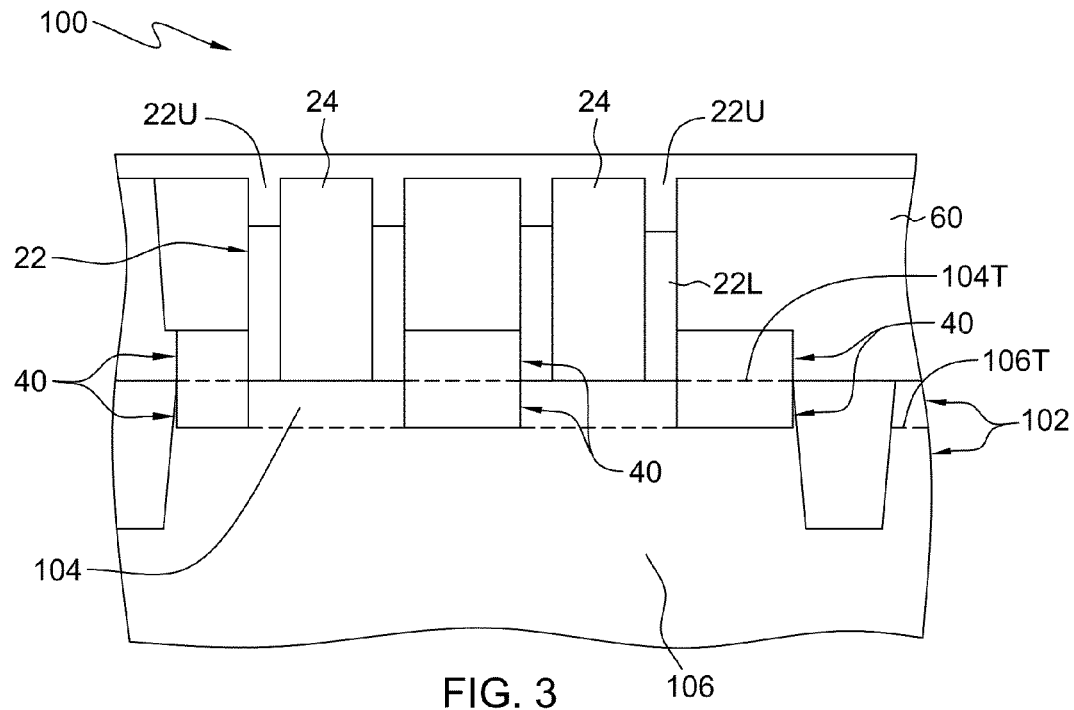

Referring to FIG. 2 a section of spacers 22 defining a top of spacers 22 can be removed. On removal of a top section of a spacer 22 a section 22L of a spacer can remain. Section 22L can be formed on the noted first spacer material. As shown in FIG. 3 a section 22U of spacer can be deposited in the areas of the removed spacer material. The section 22U can include a second spacer material different from the noted first spacer material. The second spacer material can have a stronger etch stop selectively to dielectric material 60 than the first spacer material. In one embodiment the second spacer material can be a high K material, e.g. hafnium (IV) oxide ($HfO_2$). Section 22U can be formed of a second material different from a first material forming spacer section 22L. As shown by the intermediary stage of fabrication depicted in FIG. 3, a section 22U when initially deposited can overfill an area of removed spacer material.

Figure 4:
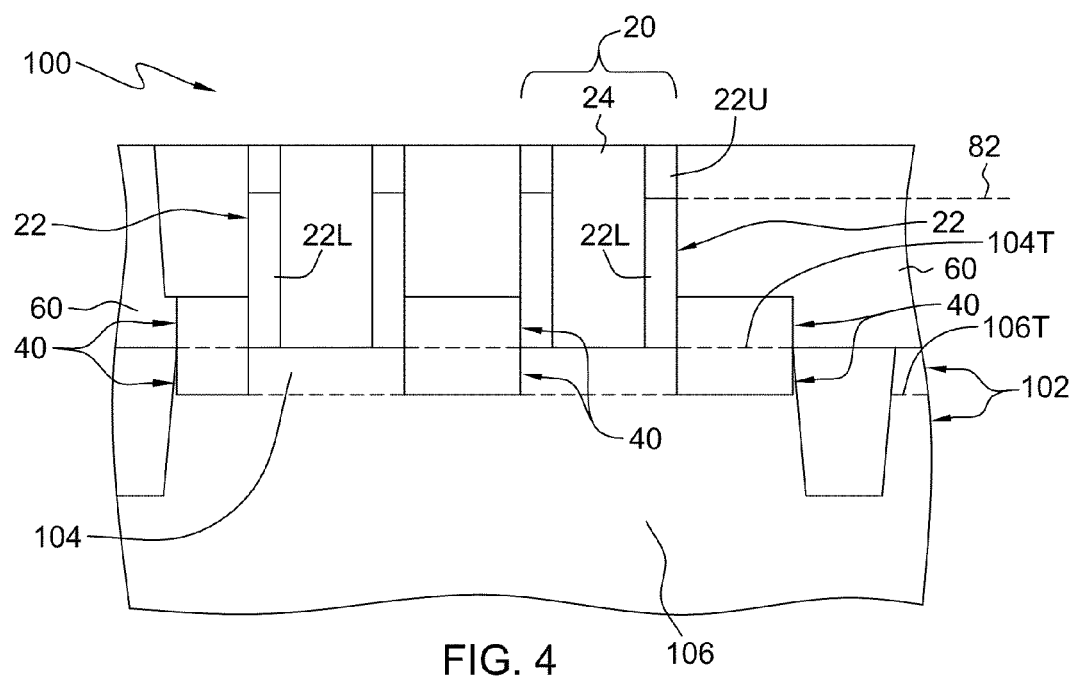

Referring to FIG. 4 the overfill portion of section 22U can be removed using e.g. CMP or etch back. Referring to FIG. 4, a resulting spacer 22 after performance of CMP to remove an overfill portion of section 22U can include section 22L and section 22U. Section 22L can be disposed below elevation 82. Section 22U can be disposed above elevation 82 and adjacent section 22L. In one embodiment section 22L can be disposed substantially entirely below elevation 82. In one embodiment, section 22U can be disposed substantially entirely above elevation 82.

Figure 5:
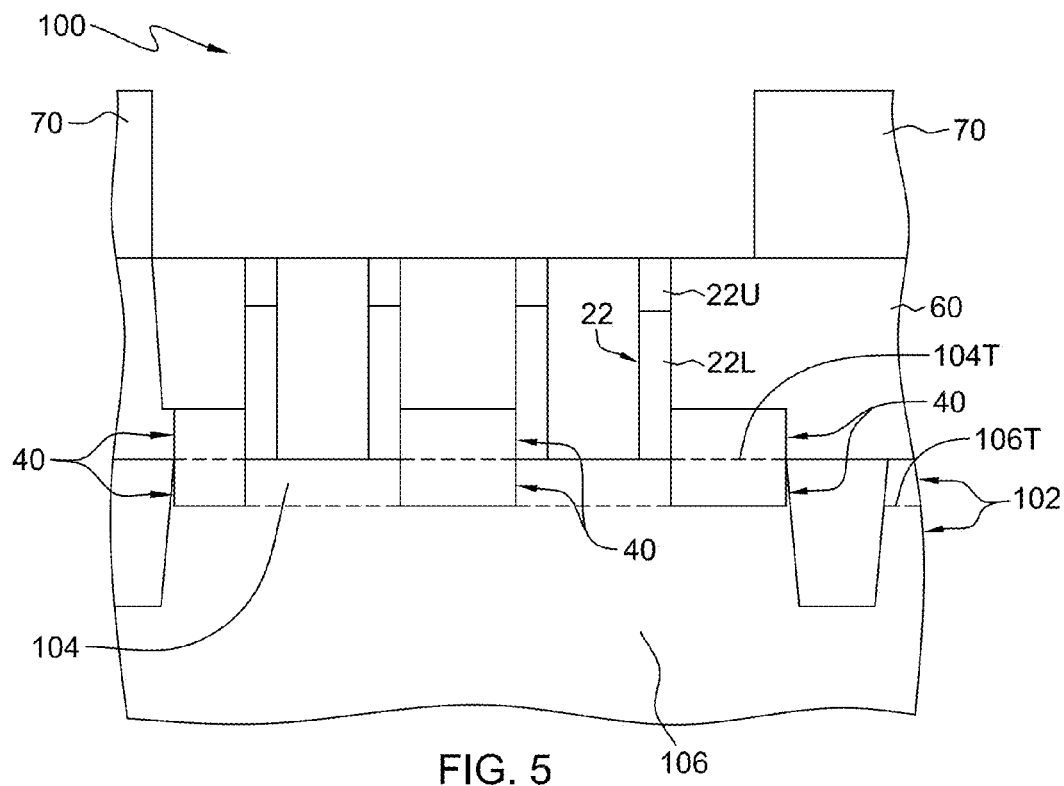

As shown in FIG. 5 a mask 70 for use in formation of contact structure 80 can be applied. With mask 70 applied, dielectric material 60 can be removed. When dielectric material 60 is removed, source/drains 40 can be exposed. With the presence of section 22U of spacers 22, spacers 22 can be substantially prevented from degrading during the etching of dielectric material 60. Without section 22U (which can be of material that is etch stop selective to etching of dielectric material 60) spacers 22 can become degraded during the removal of dielectric material 60. If a substantial portion of spacers 22 is unintentionally removed, a subsequent depositing of a conductive contact can cause unwanted shorting between a source/drain 40 and conductive gate structure 24 of gate 20.

Figure 6:
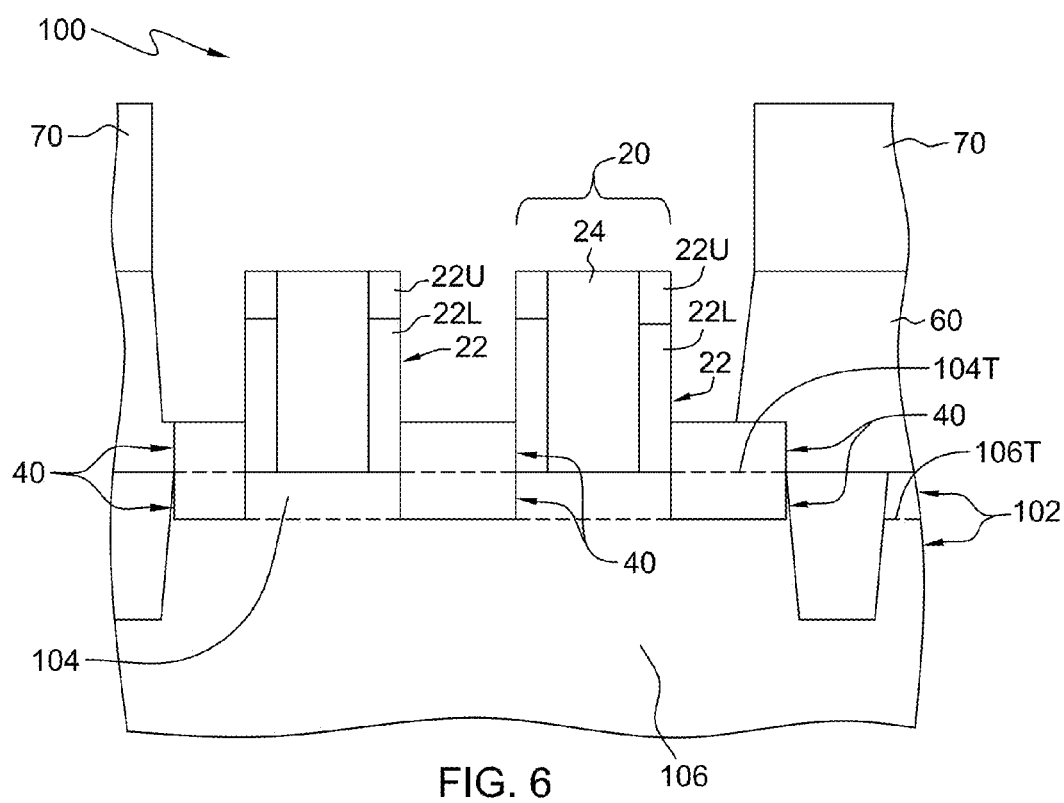
Figure 7:
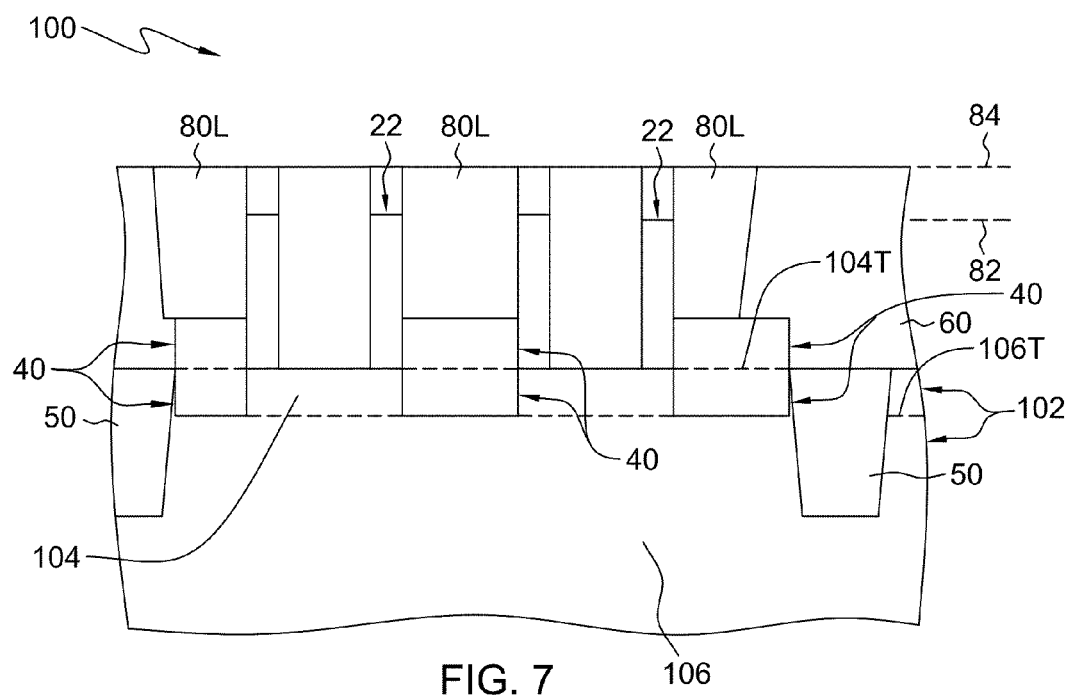

With source/drain 40 exposed as shown in FIG. 6 and with mask 70 removed, a section of contact structure 80 can be deposited as shown in FIG. 7. A lower section 80L of contact structure 80 can be formed to terminate at an elevation in common with top elevation 84 of spacers 22. Lower section 80L of contact structure 80 can first be deposited to overfill the area defined by removal of dielectric material 60 and then can be subject to CMP so that a top elevation of lower section 80L is in common with a top elevation 84 of spacers 22.

Figure 8:
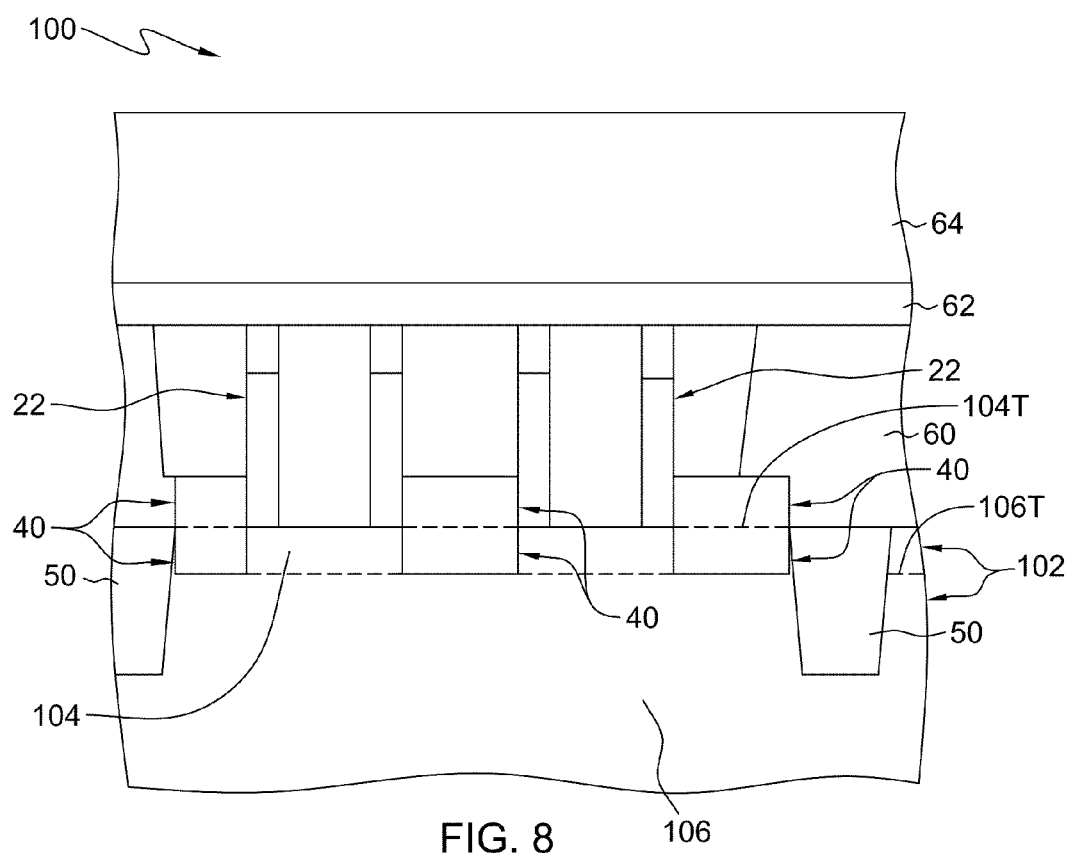
Figure 9:
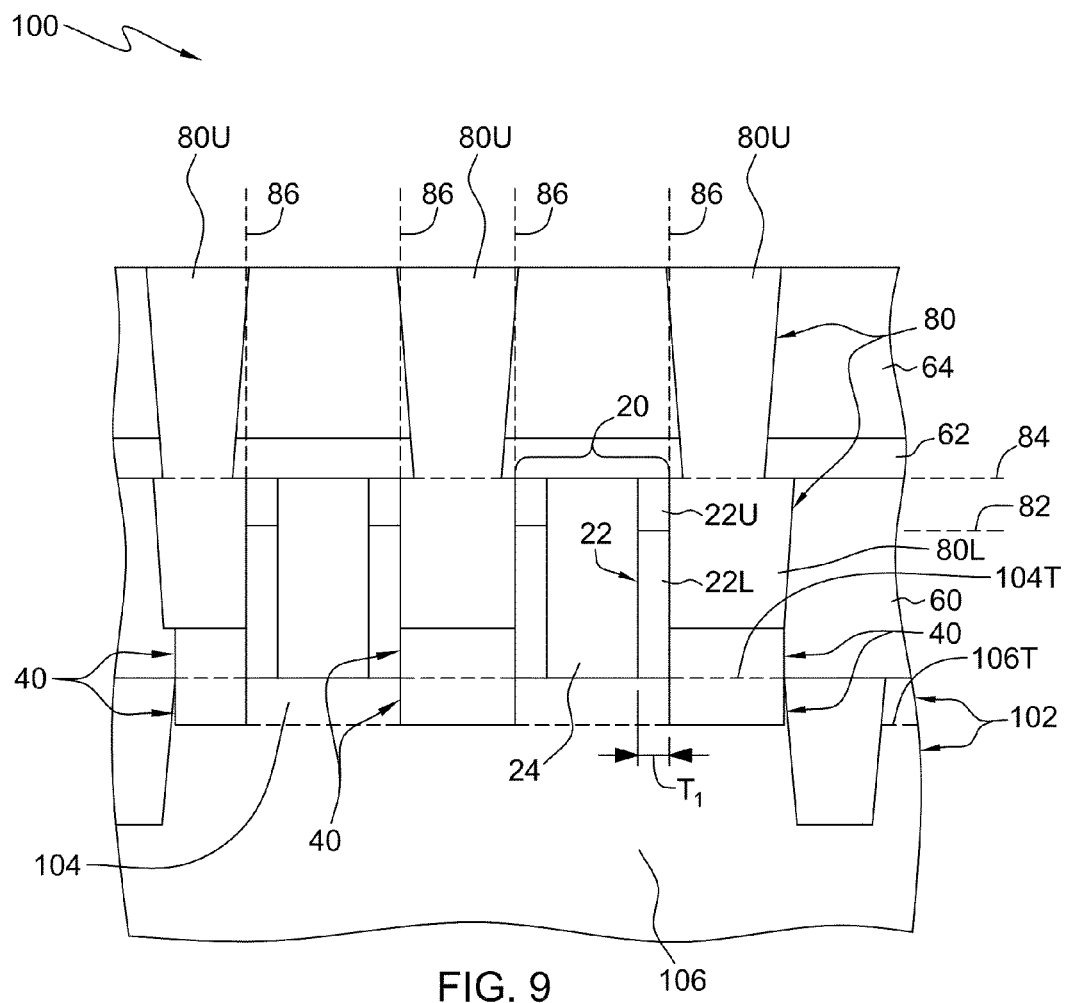
FIG. 9 is a cross-sectional view illustrating a semiconductor device having a spacer resistant to degradation.

As shown in FIG. 8 a dielectric layer 62 can be deposited. Dielectric layer 64 can then be deposited over layer 62. In one embodiment, dielectric layer 62 can include SiN and dielectric layer 62 can include oxide, e.g. $SiO_2$ Referring to FIG. 9, a contact formation process can be continued. A contact formation process as depicted in FIG. 9 can include etching holes and filling holes with conductive material to define upper section 80U. In one embodiment, each of lower section 80L and upper section 80U of contact structure 80 can be formed of Tungsten (W). Lower section 80L can be regarded as a lower layer of contact structure 80. Upper section 80U can be regarded as an upper layer of contact structure 80.

There is set forth herein as shown in FIG. 9 a semiconductor device 100 including a substrate structure 102, a gate 20 formed on the substrate structure 102, the gate having gate spacers 22 and a conductive gate structure 24 disposed intermediate the gate spacers 22, and wherein a gate spacer 22 of the gate spacers includes a first section 22L of a first material and a second section 22U of a second material, wherein the second section 22U is disposed above a first elevation 82 of the gate 20, and wherein the first section 22L is disposed below the first elevation 82 of the gate 20. In one aspect the second section 22U can include etch stop material so that spacer 22 is resistant to degradation when dielectric material 60 between gates 20 of semiconductor device 100 is removed in an intermediate fabrication stage to allow deposition of contact structure 80. Material of section 22U can be more etch stop selective to dielectric material 60 than material of spacer section 22L. In one embodiment, material of spacer section 22L can have a lower dielectric constant (K level) than a material of spacer section 22U. In one embodiment a majority of a height of spacer 22 can be defined by spacer section 22L. With spacer material forming spacer section 22L being provided by material of a lower dielectric constant a parasitic capacitance of semiconductor device 100 can be reduced.

In one aspect as shown in FIG. 9, a first section 22L of the spacer 22 through a length dimension of the gate 20 has a thickness $T_1$ in common with a thickness $T_1$ of second section 22U of the spacer 22 through a length dimension of the gate 20. In one aspect the second section 22U of spacer 22 can be disposed substantially entirely above the first elevation 82. In one aspect, a first section 22L of spacer 22 can be disposed substantially entirely below the first elevation 82. In one aspect an outer lateral boundary plane 86 of the first section 22L can be in common with an outer lateral boundary plane 86 of the second section 22U.

Figure 10:
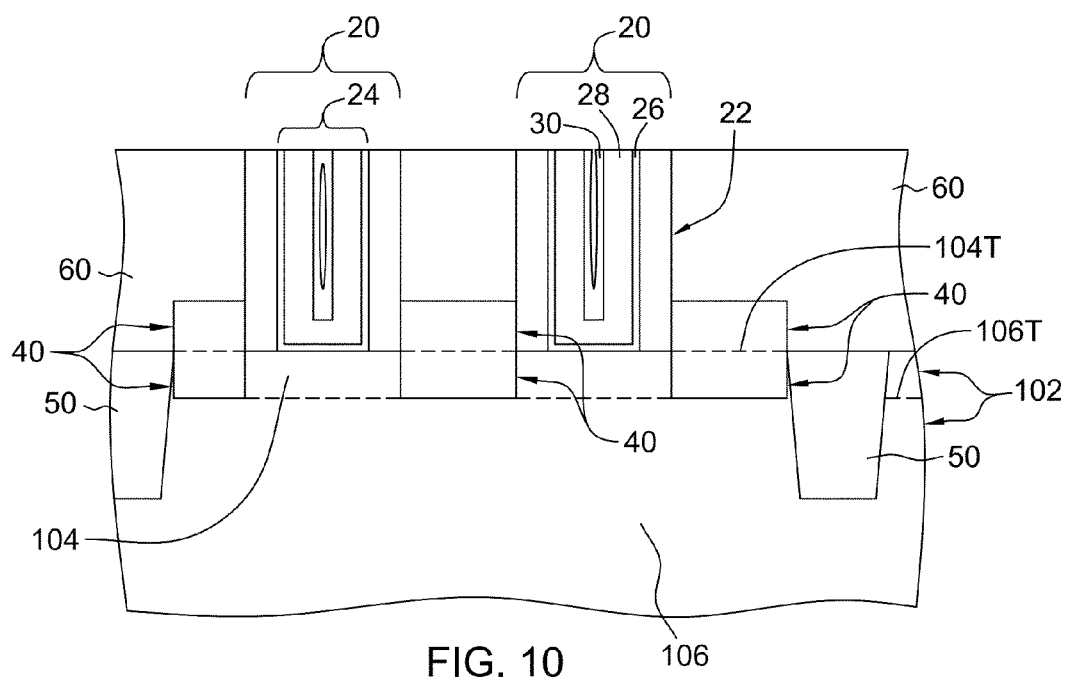
FIGS. 10-14 are cross-sectional views illustrating a semiconductor device in an intermediary stage of fabrication being fabricated for improved alignment to a conductive contact structure.

Another aspect of a semiconductor device 100 is shown and described in reference to FIGS. 10-15. A semiconductor device 100 in an intermediary fabrication stage is shown in FIG. 10. FIG. 10 illustrates a semiconductor device 100 after depositing of conductive layers metal gate structure 24 and CMP. Semiconductor device 100 can include a substrate structure 102 and one or more gate 20. Each gate 20 can include conductive gate structure 24 including one or more conductive layer. The one or more conductive layer can include conductive layer 26, conductive layer 28 and capping conductive layer 30. The structure of FIG. 10 corresponds to the structure as shown in FIG. 1 except that in FIG. 10 additional details of gate structure 24 are shown.

Semiconductor device 100 can include source/drains 40 intermediate of gates 20 and adjacent of gates 20. A FET can include gate 20 and first and second source/drains 40 disposed at first and second ends of a gate 20. Semiconductor device 100 can include shallow trench isolation formations 50 separating discrete semiconductor devices. Semiconductor device 100 can also include dielectric material 60 above source/drains 40 and adjacent gates 20. In one embodiment, spacers 22 in the intermediary stage of fabrication depicted in FIG. 10 can be formed of first spacer material, e.g. dielectric material, e.g. silicon mononitride (SiN), silicon nitride ($Si_3N_4$), or a low K dielectric material, e.g., silicon carbide (SiC), silicon boron nitride (SiBN), silicon oxyfluoride (SiOF) or silicon oxycarbide (SiOC). Each source/drain 40 can also be partially defined by an epitaxial growth section (above dashed line of element 40) and a doped substrate region (below dashed line of element 40). Substrate structure 102 in one embodiment can include a fin 104. Fin 104 can extend contiguously from bulk substrate 106. A fin 104 can extend from a top elevation 106T of bulk substrate 106 to a top elevation 104T of fin 104. In one embodiment, substrate structure 102 can be absent a fin 104.

Figure 11:
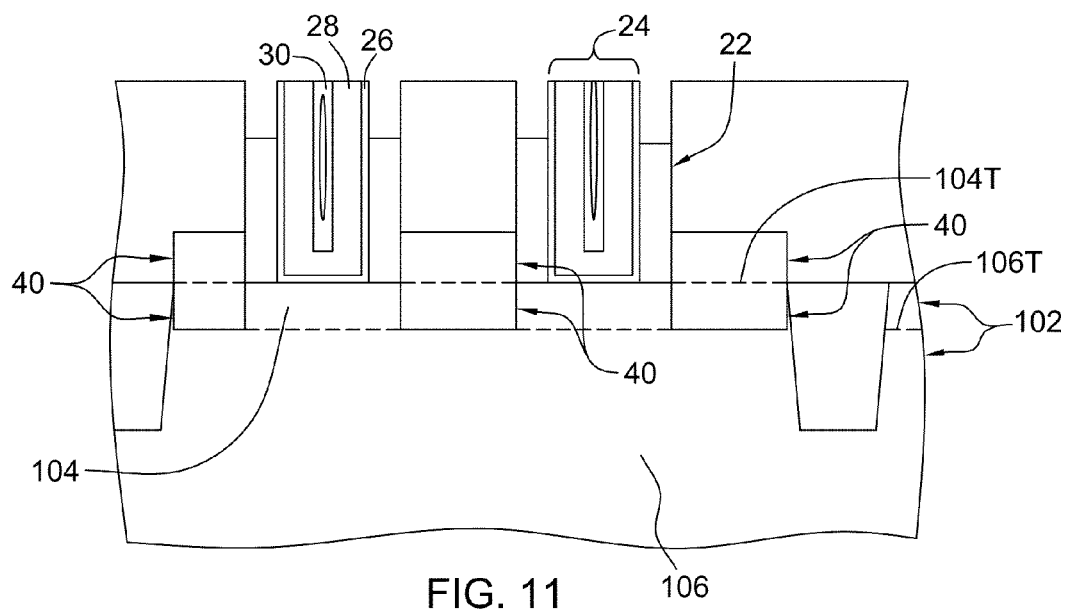

Referring to FIG. 11 a section of spacer 22 can be removed. A stage of fabrication as shown in FIG. 11 corresponds to the stage of fabrication as shown in FIG. 2 and in one embodiment, fabrication flow can process in accordance with FIGS. 3-9 to yield a structure as shown in FIG. 9. In another embodiment, a fabrication flow can proceed in accordance with the process flow set forth herein with reference to FIGS. 11-15.

Figure 12:
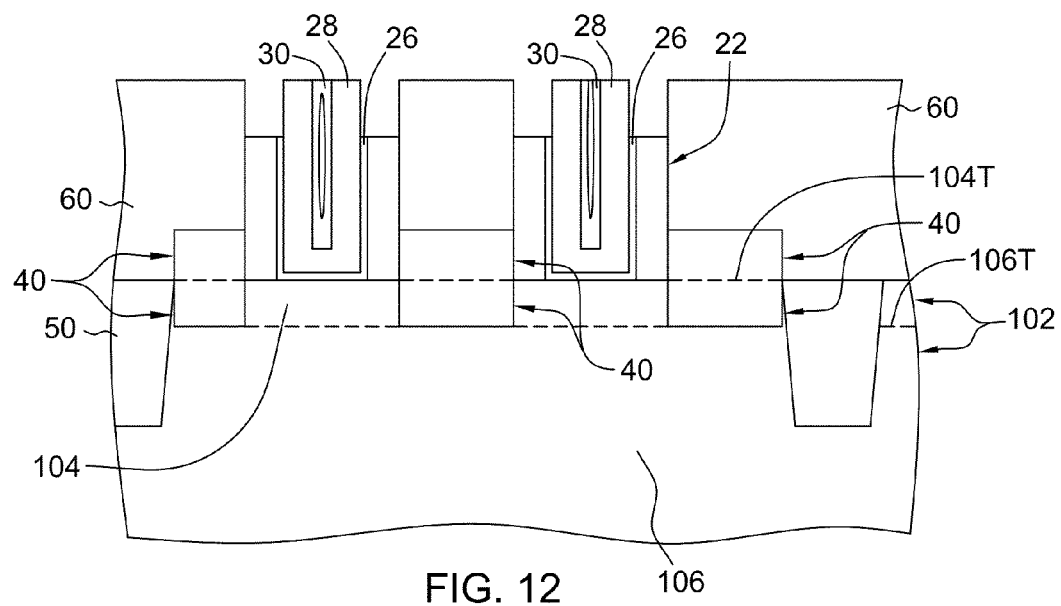

With semiconductor device 100 in a stage of fabrication as shown in FIG. 11, semiconductor device 100 can be subject to additional material removal. As shown in FIG. 12, a section of conductive layer 26 can be removed using an etching process selective to material of conductive layer 28 and conductive layer 30.

Figure 13:
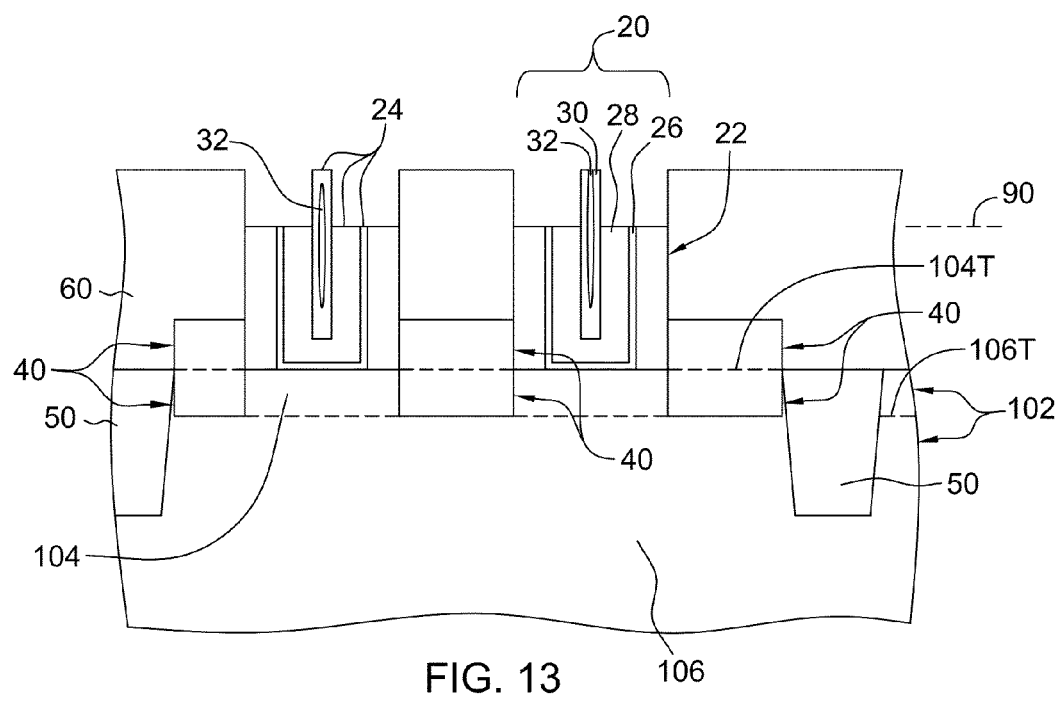

With semiconductor device 100 in a stage of fabrication as shown in FIG. 12, semiconductor device 100 can be subject to additional material removal. As shown in FIG. 13, a section of conductive layer 28 can be removed using an etching process selective to material of conductive layer 30 and to material of conductive layer 26.

With a section of conductive layer 28 removed, capping layer 30 can remain. In one embodiment, capping layer 30 can also be removed so that gate structure 24 can be absent of conductive material above elevation 90. However, fabricating semiconductor device 100 so that capping layer 30 remains provides advantages. Capping layer 30 can define a seam 32 that can extend to a lower elevation of gate structure 24. Seam 32 can extend from an elevation below elevation 90 to an elevation above elevation 90. Accordingly, fabricating semiconductor device 100 so that capping layer 30 is not removed protects lower elevation material of gate structure 24. By contrast, because of the presence of seam 32, lower elevation material of gate structure 24 below elevation 90 might be undesirably removed by etching of conductive layer 30.

Figure 14:
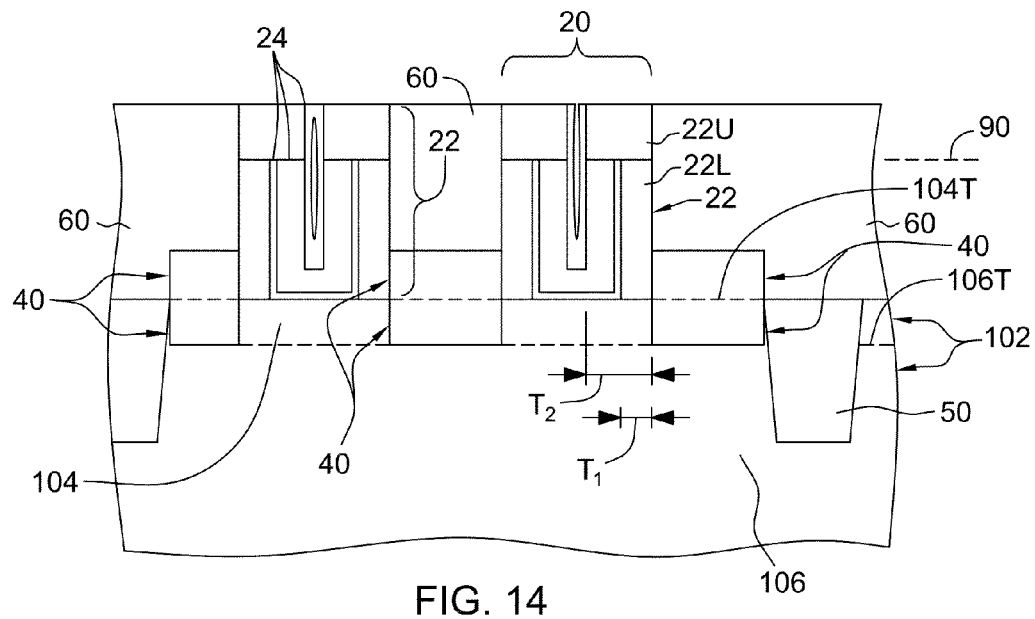

With semiconductor device 100 in the stage of fabrication as shown in FIG. 13 a section 22U of spacer 22 as set forth in FIG. 14 can be deposited in an area defined by the removal of material of spacer 22, conductive layer 26 and conductive layer 28 as set forth in FIGS. 11-13. With semiconductor device 100 in the stage of fabrication as set forth in FIG. 13, spacer 22 can include section 22L of the first spacer material and section 22U of a second spacer material. Section 22U in one embodiment can be formed of e.g., a high K material such as $HfO_2$. Section 22U can be formed of a second material different from a first material. Section 22U can be formed of material having a higher etch stop selectivity to dielectric material 60 than material that forms section 22L. Section 22U can be formed of material that initially overfill the open area defined by removal of material of spacer 22, layers 26 and 28 and then can be subject to CMP. Material of section 22U can be more etch stop selective to dielectric material 60 than material of spacer section 22L. In one embodiment, material of spacer section 22L can have a lower dielectric constant (K level) than a material of spacer section 22U. In one embodiment, a majority of a height of spacer 22 can be defined by spacer section 22L. With spacer material forming spacer section 22L being provided by material of a lower dielectric constant a parasitic capacitance of semiconductor device 100 can be reduced.

With semiconductor device 100 in the intermediary stage of fabrication depicted in FIG. 14, a mask in accordance with mask 70 as shown in FIG. 5 for use in formation of a contact structure can be applied. With a mask applied, dielectric material 60 can be removed. When dielectric material 60 is removed conductive source/drains 40 can be exposed. With the presence of section 22U where section 22U is formed of etch stop material, spacers 22 can be substantially prevented from degrading during the etching of dielectric material 60. Without section 22U of spacers 22 formed of etch stop material spacers 22 can become degraded during the removal of dielectric material 60. If a substantial portion of spacers 22 is unintentionally removed with the removal of dielectric material 60, a subsequent depositing of material of a conductive contact structure can cause unwanted shorting between a source/drain 40 and gate 20. Referring to the intermediary fabrication stage depicted in FIG. 14, spacers 22 can include section 22L of a first material disposed below elevation 90, and section 22U of a second material disposed above elevation 90. Section 22U can include a second thickness $T_2$, the thickness $T_2$ being greater than a thickness $T_1$ of the first section 22L.

Figure 15:
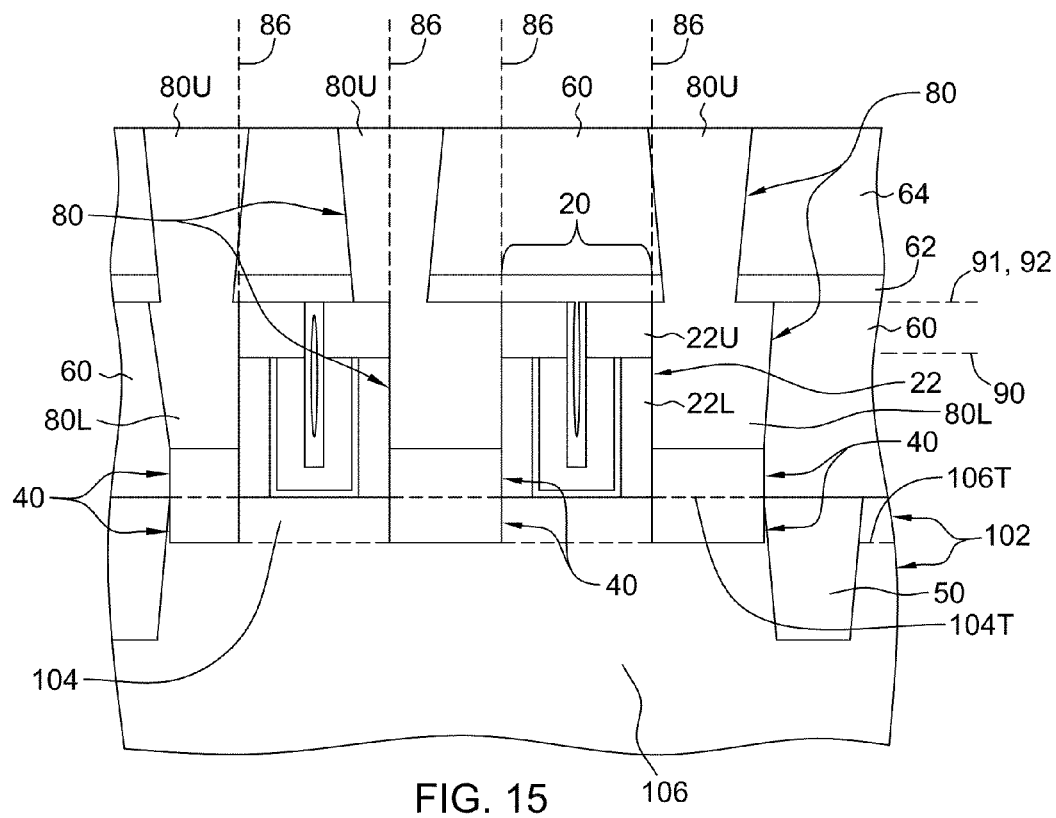
FIG. 15 is a cross-sectional view illustrating a semiconductor device adapted for improved alignment to a conductive contact structure and for reduced likelihood of electrical shortage between a gate and a source/drain.

With source/drain 40 exposed as depicted in FIG. 14, a contact structure 80 can be deposited as shown in FIG. 15. A lower section 80L of contact structure 80 can be formed to terminate at an elevation in common with a terminating elevation 90 of spacers 22. As shown in FIG. 15, a dielectric layer 62 can be deposited. Dielectric layer 64 can then be deposited over layer 62. In one embodiment, dielectric layer 62 can be provided by SiN, and dielectric layer 64 can be provided by oxide. Referring to FIG. 15 a contact formation process can be continued. A contact formation process as depicted in FIG. 15 can include etching holes and filling holes with conductive material to form upper conductive section 80U. Contact structure 80 can be formed of conductive metal, e.g. Tungsten (W). Lower section 80L can be regarded as a lower layer of contact structure 80. Upper section 80U can be regarded as an upper layer of contact structure 80.

There is set forth herein as shown in FIG. 15 a semiconductor device 100 including a substrate structure 102, a gate 20 formed on the substrate structure 102, the gate 20 having a gate spacer 22 and a conductive gate structure 24 disposed intermediate the gate spacers 22, wherein a conductive gate structure 24, includes a first conductive layer 26 and a second conductive layer 30, the first conductive layer 26 being more proximate the spacer 22 than the second conductive layer 30, wherein the first conductive layer 26 terminates at a first elevation 90 and wherein the second conductive layer 30 terminates at a second elevation 91, the second elevation being above the first elevation 90.

In one aspect as shown in FIG. 15, the spacer 22 can terminate at a spacer top elevation 92, the spacer top elevation 92 being above the first elevation 90. In another aspect as shown in FIG. 15, the conductive gate structure 24 can include a first length at elevations below the first elevation 90 and a second length at elevations above the first elevation 90, the second length being less than the first length. In another aspect as shown in the embodiment of FIG. 15, a spacer 22 can include a first thickness $T_1$ along a gate length dimension of the gate 20 at an elevation below the first elevation 90 and the spacer 22 can include a second thickness $T_2$ along a gate length dimension of the gate 20 an elevation above the first elevation 90. The second thickness $T_2$ can be greater than the first thickness $T_2$. In another aspect as shown in FIG. 15, an outer lateral boundary plane 86 of the spacer 22 can be common for spacer elevations below the first elevation and above the first elevation.

In one aspect as shown in the embodiment of FIG. 15, a spacer top elevation 92 can be in common with the second elevation 91 (the top elevation of conductive layer 30 in the embodiment of FIG. 15). In another aspect, a lower section 80L of a contact structure 80 of the semiconductor device 100 can extend to the spacer top elevation 92. In one aspect, the spacer 22 can include a first thickness $T_1$ along a gate length dimension of the gate 20 at an elevation below the first elevation 90, and the spacer 22 has a second thickness $T_2$ along a gate length dimension of the gate 20 an elevation above the first elevation 90, wherein the second thickness $T_2$ is greater than the first thickness $T_1$. In one aspect, the spacer 22 can include a first section 22L of a first material and a second section 22U of a second material, the second section 22U being above the first section 22L, and adjacent to the first section 22L. In one aspect, the second conductive layer 30 can include a seam 32 extending from an elevation below the first elevation 90 to an elevation above the first elevation 90.

As depicted in FIG. 15 a reduced length gate structure 24 at an upper elevation section thereof can reduce a likelihood of an electrical short resulting from depositing of conductive contact structure 80. As depicted in FIG. 15, an upper section 80U of conductive contact structure 80 can be misaligned and yet, an electrical shorting can be avoided by the presence of a gate structure 24 depicted in FIG. 15 having an upper elevation of reduced length. The conductive gate structure as depicted in FIG. 15 increases the degree to which upper section 80U can be misaligned without causing electrical shorting.

In one aspect referring to FIGS. 1-15, substrate structure 102 can be formed of a semiconductor material, e.g. Si. Substrate structure 102 can be a doped semiconductor. In one embodiment a section of fin 104 can be doped to partially define source/drain 40. A section of substrate 102 e.g. a section of bulk substrate 106 can be doped with a doping of polarity opposite a polarity of source/drain 40. A doped section of bulk substrate 106 having a doping of an opposite polarity to source/drains 40 can define a doped well of semiconductor device 100. A doped well can be formed in a section of a bulk substrate 106 of semiconductor device 100. When gate 20 is turned on by application of a voltage thereto, a channel can be defined in fin 104 of substrate 102 adjacently below gate 20 and between first and second source/drains 40.

Each of material forming spacer section 22U, conductive lower section 80L, conductive upper section 80U, dielectric layer 62, and dielectric layer 64 can be deposited using any of a variety of deposition processes, including, for example, physical vapor deposition (PVD), atomic layer deposition (ALD), chemical vapor deposition (CVD), sputtering, or other known processes, depending on the material composition of the layer.

In one example, protective mask 70 as set forth herein may include a material such as, for example, silicon nitride, silicon oxide, or silicon oxynitride, and may be deposited using conventional deposition processes, such as, for example, CVD or plasma-enhanced CVD (PECVD). In other examples, other mask materials may be used depending upon the materials used in semiconductor device 100. For instance, a protective mask 70 may be or include an organic material. For instance, mask 70 can include, e.g., litho coating material such as organic dielectric material (OCL), flowable oxide such as, for example, a hydrogen silsesquioxane polymer, or a carbon-free silsesquioxane polymer, may be deposited by flowable chemical vapor deposition (F-CVD). In another example, a protective mask 70 may be or include an organic polymer, for example, polyacrylate resin, epoxy resin, phenol resin, polyamide resin, polyimide resin, unsaturated polyester resin, polyphenylene ether resin, polyphenylenesulfide resin or benzocyclobutene (BCB).

Removing material as set forth herein such as material of spacer 22, conductive layer 26, conductive layer 28, conductive layer 30, and material 60 as set forth herein can be achieved by any suitable etching process, such as dry or wet etching processing. In one example, isotropic dry etching may be used by, for example, ion beam etching, plasma etching or isotropic reactive ion etching (RIE). In another example, isotropic wet etching may also be performed using etching solutions selective to the material subject to removal.

A semiconductor device 100 as set forth herein can include a discrete semiconductor device e.g. a field effect transistor (FET). A semiconductor device 100 herein can include a plurality of discrete semiconductor devices. A semiconductor device 100 as set forth herein can be e.g. a semiconductor wafer or integrated circuit including a plurality of discrete semiconductor devices. In each of FIGS. 1-15 there is depicted first and second FETs, the first FET having the left most source/drain 40 and the center source/drain 40, the second FET having the right most source/drain 40 and sharing the center source/drain 40 with the first FET. A channel can be defined adjacently below each gate 20 and between a pair of source/drains 40. In one embodiment, by way of doping of a section thereof, bulk substrate 106 can define a doped well. A doped well can have a polarity opposite a polarity of source/drains 40.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A semiconductor device comprising:
  a semiconductor substrate structure having a source and a drain of a first polarity and a doped well of a second polarity opposite the first polarity;
  a gate formed on the substrate structure, the gate having gate spacers and a conductive gate structure disposed intermediate the gate spacers;
  a dielectric material disposed on the substrate structure; and
  contact structures in conductive contact with the source and the drain, the contact structures disposed between and adjacent both the gate spacers and the dielectric material,
  wherein a gate spacer of the gate spacers includes a first section of a first material and a second section of a second material the second material having a stronger etch stop selectivity to the dielectric material than the first material,
  wherein the second section is disposed substantially entirely above the first elevation, and the first section is disposed substantially entirely below the first elevation,
  wherein the first section of the spacer has a first thickness at the first elevation along a gate length dimension of the gate, and the second section of the spacer has a second thickness at the first elevation along a gate length dimension of the gate,
  wherein the second thickness is greater than the first thickness,
  wherein the conductive gate structure including a first conductive layer and a second conductive layer, the first conductive layer terminating at the first elevation and the second conductive layer terminating at a second elevation, the second elevation being above the first elevation, and wherein the second section of the spacer being disposed above and adjacent both the first section of the spacer and the first conductive layer.

2. The semiconductor device of claim 1, wherein the second section includes an etch stop material.

3. The semiconductor device of claim 1, wherein the second section is disposed substantially entirely above the first elevation.

4. The semiconductor device of claim 1, wherein the first section is disposed substantially entirely below the first elevation.

5. The semiconductor device of claim 1, wherein an outer lateral boundary plane of the first section is in common with an outer lateral boundary plane of the second section.

6. The semiconductor device of claim 1 comprising the second section being resistant to degradation when a portion of the dielectric material disposed adjacent the gate spacer is removed in an intermediate fabrication stage to allow deposition of the contact structure.

7. The semiconductor device of claim 6 wherein the first section of the gate spacer is not substantially degraded when such portion of dielectric material is removed due to the second material of the second section having a stronger etch stop selectivity to the dielectric material than the first material of the first section.

* * * * *